(12) United States Patent
Trottier-Lapointe et al.

(10) Patent No.: US 11,867,876 B2
(45) Date of Patent: Jan. 9, 2024

(54) OPTICAL ARTICLE HAVING DIRECTIONAL MICRO- OR NANOSTRUCTURED THIN FILM COATING, AND ITS PROCESS

(71) Applicants: CORPORATION DE L'ECOLE POLYTECHNIQUE DE MONTREAL, Montreal (CA); Essilor International, Charenton-le-Pont (FR)

(72) Inventors: William Trottier-Lapointe, Charenton-le-Pont (FR); Bruce Faure, Charenton-le-Pont (FR); Bill Baloukas, Montreal (CA); Richard Vernhes, Montreal (CA); Oleg Zabeida, Montreal (CA); Ludvik Martinu, Montreal (CA); Sasha Woodward, Montreal (CA); Nicolas Desjardins-Lecavalier, Montreal (CA); Julien Gagnon, Montreal (CA)

(73) Assignees: Corporation de l'Ecole Polytechnique de Montreal, Montreal (CA); Essilor International, Charenton-le-Pont (FR)

( * ) Notice: Subject to any disclaimer, the term of this patent is extended or adjusted under 35 U.S.C. 154(b) by 496 days.

(21) Appl. No.: 17/252,079

(22) PCT Filed: Jun. 13, 2019

(86) PCT No.: PCT/EP2019/065529
§ 371 (c)(1),
(2) Date: Dec. 14, 2020

(87) PCT Pub. No.: WO2019/238836
PCT Pub. Date: Dec. 19, 2019

(65) Prior Publication Data
US 2021/0263195 A1    Aug. 26, 2021

(30) Foreign Application Priority Data
Jun. 15, 2018 (EP) .................................. 18305738

(51) Int. Cl.
*G02B 1/118* (2015.01)
*C03C 17/34* (2006.01)
(Continued)

(52) U.S. Cl.
CPC .......... *G02B 1/118* (2013.01); *C03C 17/3435* (2013.01); *C23C 14/083* (2013.01);
(Continued)

(58) Field of Classification Search
CPC ........ G02B 1/118; G02B 1/002; G02B 5/003; C03C 17/3435; C03C 2217/213;
(Continued)

(56) References Cited

U.S. PATENT DOCUMENTS

| | | |
|---|---|---|
| 4,211,823 A | 7/1980 | Suzuki et al. |
| 5,015,523 A | 5/1991 | Kawashima et al. |

(Continued)

FOREIGN PATENT DOCUMENTS

| | | |
|---|---|---|
| EP | 0 404 111 | 12/1990 |
| EP | 0 614 957 | 9/1994 |

(Continued)

OTHER PUBLICATIONS

International Search Report for PCT/EP2019/065529 dated July 26, 2019, 4 pages.

(Continued)

*Primary Examiner* — William R Alexander
(74) *Attorney, Agent, or Firm* — NIXON & VANDERHYE, PC

(57) ABSTRACT

An optical article includes a substrate with front and rear main faces, one main face coated with a columnar micro- or nano-structured coating. The substrate and optical article are transparent in at least a part of the visible region ranging from 380 to 780 nm, along at least one incidence angle. The columnar micro- or nano-structured coating includes an (Continued)

array of columns including each a core and an upper layer covering the core, the core and the upper layer being structurally and/or chemically different and have light absorbing properties with an extinction coefficient "k" ≥10-2 in the spectrum 250-2500 nm and are able to cause a change in transmission or in reflection of incident light through the optical article as a function of the angle of incidence of light. Also disclosed is a method for manufacturing an optical article including a columnar micro- or nano-structured coating.

20 Claims, 3 Drawing Sheets

(51) Int. Cl.
| | | |
|---|---|---|
| C23C 14/08 | (2006.01) | |
| C23C 14/10 | (2006.01) | |
| C23C 14/22 | (2006.01) | |
| C23C 14/30 | (2006.01) | |
| C23C 16/34 | (2006.01) | |
| C23C 16/455 | (2006.01) | |
| C23C 16/56 | (2006.01) | |
| C23C 28/04 | (2006.01) | |
| G02C 7/10 | (2006.01) | |

(52) U.S. Cl.
CPC ............ *C23C 14/10* (2013.01); *C23C 14/226* (2013.01); *C23C 14/30* (2013.01); *C23C 16/34* (2013.01); *C23C 16/45555* (2013.01); *C23C 16/56* (2013.01); *C23C 28/042* (2013.01); *G02C 7/104* (2013.01); *C03C 2217/213* (2013.01); *C03C 2217/219* (2013.01); *C03C 2217/281* (2013.01); *C03C 2217/73* (2013.01); *C03C 2217/78* (2013.01); *C03C 2217/948* (2013.01); *C03C 2218/151* (2013.01); *C03C 2218/152* (2013.01)

(58) Field of Classification Search
CPC ........ C03C 2217/219; C03C 2217/281; C03C 2217/73; C03C 2217/78; C03C 2217/948; C03C 2218/151; C03C 2218/152; C23C 14/083; C23C 14/10; C23C 14/226; C23C 14/30; C23C 14/022; C23C 14/08; C23C 16/34; C23C 16/45555; C23C 16/56; C23C 28/042; G02C 7/104; G02F 1/157
USPC .................................................. 351/159.65
See application file for complete search history.

(56) References Cited

U.S. PATENT DOCUMENTS

| | | |
|---|---|---|
| 5,081,192 A | 1/1992 | Tatemoto |
| 5,316,791 A | 5/1994 | Farber et al. |
| 5,359,444 A | 10/1994 | Piosenka et al. |
| 5,739,639 A | 4/1998 | Johnson |
| 5,763,061 A | 6/1998 | Ochiai et al. |
| 5,866,204 A | 2/1999 | Robbie et al. |
| 5,922,787 A | 7/1999 | Kondo et al. |
| 6,183,872 B1 | 2/2001 | Tanaka et al. |
| 6,206,065 B1 | 3/2001 | Robbie et al. |
| 6,277,485 B1 | 8/2001 | Invie et al. |
| 6,337,235 B1 | 1/2002 | Miyanaga et al. |
| 8,503,122 B2 | 8/2013 | Liu et al. |
| 8,668,984 B2* | 3/2014 | Martin ................ H01M 14/005 428/419 |
| 9,731,248 B2* | 8/2017 | Umehara ............... B01D 69/12 |
| 10,478,802 B2* | 11/2019 | Cohen ...................... C03C 17/34 |
| 10,557,193 B2* | 2/2020 | Liimatainen ........ H01M 4/0402 |
| 2004/0247880 A1* | 12/2004 | Valette ............... C08G 59/1438 528/106 |
| 2009/0211632 A1* | 8/2009 | Brett ............... H01L 31/022433 438/57 |
| 2010/0109201 A1* | 5/2010 | Fletcher ................ G03F 7/0002 216/11 |
| 2012/0090669 A1* | 4/2012 | Martin ................ H01M 14/005 428/323 |
| 2014/0336039 A1* | 11/2014 | Cohen .................... C09D 5/006 502/159 |
| 2015/0017386 A1* | 1/2015 | Kolb ....................... C08J 7/0427 522/172 |
| 2015/0143995 A1* | 5/2015 | Umehara ............... B01D 69/12 96/13 |
| 2015/0228415 A1* | 8/2015 | Seok .................... H01G 9/2027 136/256 |
| 2017/0296981 A1* | 10/2017 | Umehara ............. B01D 53/228 |
| 2017/0342544 A1* | 11/2017 | Liimatainen ........ H01M 4/0402 |
| 2019/0154622 A1* | 5/2019 | Gabardo ............ G01N 27/3277 |

FOREIGN PATENT DOCUMENTS

| | | |
|---|---|---|
| EP | 0 680 492 | 11/1995 |
| EP | 0 933 377 | 8/1999 |
| EP | 2 142466 | 1/2010 |
| FR | 2 702 486 | 9/1994 |
| FR | 2 734 827 | 12/1996 |
| FR | 2 943 798 | 10/2010 |
| JP | 63-87223 | 4/1988 |
| JP | 63-141001 | 6/1988 |
| WO | 94/17116 | 8/1994 |
| WO | 2008/123935 | 10/2008 |
| WO | 2009/100519 | 8/2009 |
| WO | 2011080472 | 7/2011 |
| WO | 2012/027587 | 3/2012 |
| WO | 2015/013631 | 1/2015 |
| WO | 2017/194871 | 11/2017 |

OTHER PUBLICATIONS

Written Opinion of the ISA for PCT/EP2019/065529 dated Jul. 26, 2019, 9 pages.
Khan et al., "Mechanically robust antireflective coatings" Nano Research, Febmary 2, 2018, 8 pages.
Jim et al., "Ultrathinlayer Chromatography nanostructures modified by atomic layer deposition" Journal of Chromatography A, May 2013, vol. 1299, pp. 118-125.
Li et al., "Ultrafast Coloring-Bleaching Performance of Nanoporous WO3—SiO2 Gasochromic Films Doped with PD Catalyst", ACS Applied Materials and Interfaces, 2011, vol. 3, pp. 4573-4579.
Mbise et al., "Angular selective window coatings: theory and experiments", Journal of Physics D: Applied Physics, 1997, vol. 30, pp. 2103-2122.
Mongstad et al., "A new thin film photochromic material: Oxygen-containing yttrium hydride", Solar Energy Materials and Solar Cells, 2011, vol. 95, pp. 3596-3599.
Babulanam et al., "Thermochromic VO2 Films for Energy-Efficient Windows", Solar Energy Materials, 1987, vol. 16, pp. 347-363.

* cited by examiner

OPTICAL ARTICLE HAVING DIRECTIONAL MICRO- OR NANOSTRUCTURED THIN FILM COATING, AND ITS PROCESS

This application is the U.S. national phase of International Application No. PCT/EP2019/065529 filed Jun. 13, 2019 which designated the U.S. and claims priority to EP Patent Application No. 18305738.9 filed Jun. 15, 2018, the entire contents of each of which are hereby incorporated by reference.

BACKGROUND OF THE INVENTION

1. Field of the Invention

The present invention relates to an optical article comprising on one of its main faces, such as its rear face and/or its front face, a specific columnar micro- or nano-structured coating which absorbs light based on the direction of the incoming light. The optical article may be used especially as an ophthalmic lens, for instance spectacle lenses.

The present invention also relates to a method of manufacturing an optical article comprising on one of its main faces such columnar micro- or nano-structured coating.

2. Description of Related Art

It is known to coat optical articles such as ophthalmic lenses or screens, whether mineral or organic, with interference coatings. These interference coatings are generally formed of a multilayer stack of dielectric mineral materials such as SiO, $SiO_2$, $Si_3N_4$, $TiO_2$, $ZrO_2$, $Al_2O_3$, $MgF_2$ or $Ta_2O_5$. Traditional antireflective coatings are designed and optimized to reduce reflection on the lens surface in the visible region, typically within the spectrum range of 380 to 780 nm. They are also designed, especially in the case of an ophthalmic lens, to prevent the formation of annoying reflections to the wearer and his interlocutors. A reflective coating achieves the opposite effect, that is, it increases the reflection of light rays. Such a type of coating is used, for example, to obtain a mirror effect in solar lenses.

However, light directionality is not easily managed with these kinds of traditional interference coatings. Indeed, for a standard antireflective coating or a mirror coating, the residual reflected color changes as a function of the incident angle as the electromagnetic spectrum moves towards lower wavelengths. This phenomenon is called the blue shift.

However, the total transmitted light does not change substantially and once again cannot easily be managed with such traditional coatings. Therefore, creating an interferential thin film coating that has a neutral residual color, while being able to decrease transmission (or to increase absorption) as a function of the angle of incidence is not easy, or even impossible as these parameters (incidence angle, residual reflected light and transmission) cannot be fully optimized independently.

Different kinds of solutions have been proposed in the prior art to manage the light absorption or the light transmission as function of the incident light.

For instance, document U.S. Pat. No. 8,503,122 describes a film stack having a light control film and a color shifting film proximate to one another. Especially, the light control film is configured to regulate the directionality of transmitted light. The document describes hence the addition of a filter to reduce the visibility of a display, such as a computer screen, based on the angle of incidence.

It is also known from the prior art that polarized films reduce light from reflections and/or absorption. However, an optical article such as an ophthalmic lens comprising such a polarized film generally has a maximum light transmission of 50% by default, which might be too limiting, for example for night driving where lens transmission must be higher than 80%.

SUMMARY OF THE INVENTION

It is therefore an object of the present invention to provide an optical article that is able to selectively absorb the light as a function of the angle of incidence in at least a part of the light spectrum ranging, especially from 250 to 2500 nm, such as 250 to 1400 nm.

Especially, an object of the present invention is to provide an optical article that is able to modulate the light transmission or the light absorption according to the directionality of the light, while having at the same time an aesthetically pleasing appearance.

For that purpose, the present invention relates to an optical article comprising a substrate with a front main face and with a rear main face, at least one of the main faces being coated with a columnar micro- or nano-structured coating, wherein the substrate and the optical article are transparent or can be put in a state where they are transparent in at least a part of the visible region ranging from 380 to 780 nm, along at least one incidence angle;

said columnar micro- or nano-structured coating comprises at least an array of columns comprising each a core and an upper layer covering said core, the core and the upper layer being structurally and/or chemically different and wherein said core and/or upper layer have light absorbing properties or can be put in a state where they have light absorbing properties with an extinction coefficient "k" equal to or higher than $10^{-2}$ in at least a part of the light spectrum ranging from 250 to 2500 nm and are able to cause a change in transmission or in reflection of incident light through the optical article as a function of the angle of incidence of light.

The present invention also relates to a method of manufacture of an optical article comprising a substrate with a front main face and with a rear main face, at least one of the main faces being coated with a columnar micro- or nano-structured coating, wherein the substrate and the optical article are transparent or can be put in a state where they are transparent in at least a part of the visible region ranging from 380 to 780 nm, along at least one incidence angle;

said columnar micro- or nano-structured coating comprises at least an array of columns comprising each a core and an upper layer covering said core, where the core and the upper layer are structurally and/or chemically different and have light absorbing properties or can be put in a state where they have light absorbing properties with an extinction coefficient "k" equal to or higher than $10^{-2}$ in at least a part of the light spectrum ranging from 250 to 2500 nm;

the method comprising the following steps:

(a) depositing on the at least one main surface of the substrate, the core by physical directional deposition, preferably by glancing angle deposition, to create the array of columns;

(b) depositing, on the core of the columns, at least the upper layer by a deposition technique, preferably by atomic layer deposition or by electroless plating. or other technique providing a conformal deposition;

the parameters of the deposition of the core and of the upper layer being controlled to provide a change in transmission or reflection of incident light through the optical article as a function of the angle of incidence of light.

Preferably, the upper layer is in direct contact with the core.

As used herein, a "deposition technique" means any technique that would deposit material in a conformal manner at the nanometric scale, such as atomic layer deposition (ALD), chemical vapor deposition (CVD), galvanic plating, electroless plating, etc.

BRIEF DESCRIPTION OF THE DRAWINGS

The present invention will be described in more detail by referring to the appended drawings, wherein.

DETAILED DESCRIPTION

1. Definitions

Figure 1:
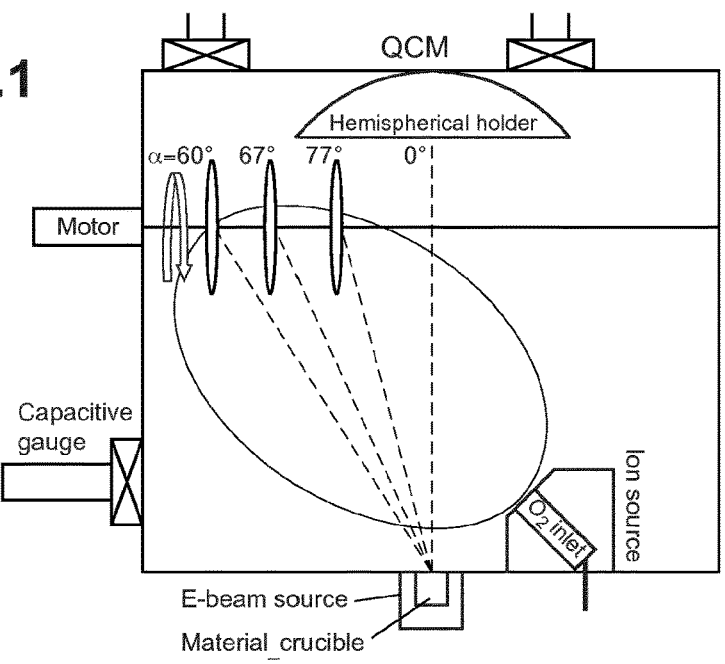
FIG. 1 is a schematic representation of the deposition chamber for performing glancing angle deposition (GLAD)

The terms "comprise" (and any grammatical variation thereof, such as "comprises" and "comprising"), "have" (and any grammatical variation thereof, such as "has" and "having"), "contain" (and any grammatical variation thereof, such as "contains" and "containing"), and "include" (and any grammatical variation thereof, such as "includes" and "including") are open-ended linking verbs. They are used to specify the presence of stated features, integers, steps or components or groups thereof, but do not preclude the presence or addition of one or more other features, integers, steps or components or groups thereof. As a result, a method, or a step in a method, that "comprises," "has," "contains," or "includes" one or more steps or elements possesses those one or more steps or elements, but is not limited to possessing only those one or more steps or elements.

Unless otherwise indicated, all numbers or expressions referring to quantities of ingredients, ranges, reaction conditions, etc. used herein are to be understood as modified in all instances by the term "about."

Also, unless otherwise indicated, the indication of an interval of values «from X to Y» or "between X to Y", according to the present invention, means as including the values of X and Y.

In the present application, when an optical article comprises one or more coatings onto the surface thereof, the expression "to deposit a layer or a coating onto the article" is intended to mean that a layer or a coating is deposited onto the external (exposed) surface of the outer coating of the article, that is to say its coating that is the most distant from the substrate.

A coating, that is said to be "on" a substrate or deposited "onto" a substrate is defined as a coating, which (i) is positioned above the substrate, (ii) is not necessarily in contact with the substrate, that is to say one or more intermediate coatings may be arranged between the substrate and the coating in question, and (iii) does not necessarily completely cover the substrate.

According to an embodiment of the invention, the coating on a substrate or deposited onto a substrate is in direct contact with this substrate or is in direct contact with a hard coat deposited onto the substrate.

When "a layer 1 is lying under a layer 2", it is intended to mean that layer 2 is more distant from the substrate than layer 1.

As used herein, the rear (or the inner) face of the substrate is intended to mean the face which, when using the article, is the nearest from the wearer's eye. It is generally a concave face. On the contrary, the front face of the substrate, is the face which, when using the article, is the most distant from the wearer's eye. It is generally a convex face.

According to the invention, the "angle of incidence (symbol θ)" is the angle formed by a ray light incident on an optical article surface and a normal to the surface at the point of incidence.

Also, according to the invention, "by columns" composing the columnar micro- or nano-structured coating that is generally obtained by physical directional deposition, it means that columns are deposited at the nanometric scale and with high porosity or voids; the individual columns would not have direct contact with neighboring columns, but could have direct contact as porosity decreases. Geometry is not limited to columns as they could have a cone shape or inversed cone shape, pyramid shape, ridge shape, etc. where the individual columns would become laterally bigger or smaller as the thickness of the film increases.

In the present application, the extinction coefficient "k" is related to the absorption coefficient $k_1$ from Beer-Lambert's law, i.e.: $k_1=4\pi k/\lambda$, where $\lambda$ is the wavelength of light.

According to the invention, by "an upper layer covering the core" is meant that the upper layer covers at least part of the column core. In embodiments, the upper layer covers the entirety of the columnar core structure. In other embodiments, the upper layer covers only partly the columnar core structure.

2. The Optical Article of the Invention

As previously mentioned, the present invention relates to an optical article comprising a substrate with a front main face and with a rear main face, at least one of the main faces being coated with a columnar micro- or nano-structured coating, wherein the substrate and the optical article are transparent or can be put in a state where they are transparent in at least a part of the visible region ranging from 380 to 780 nm, along at least one incidence angle;

said columnar micro- or nano-structured coating comprises at least an array of columns comprising each a core and an upper layer covering said core, the core and the upper layer being structurally and/or chemically different and have light absorbing properties or can be put in a state where they have light absorbing properties with an extinction coefficient "k" equal to or higher than $10^{-2}$ in at least a part of the light spectrum ranging from 250 to 2500 nm and are able to cause a change in transmission or in reflection of incident light through the optical article as a function of the angle of incidence of light.

As used herein, a "transparent substrate in the visible light ranges (380-780 nm)" means a substrate that, in at least one angle of incidence, has a light absorption up to 0.2%. Indeed, above 0.2%, a substrate is considered to be opaque.

Also, as used herein and as it will be described hereafter, the expression "can be put in a state" means that the substrate or the core and/or the upper layer of the columnar micro- or nano-structured coating may be put in a state that changes their properties. Especially, they can switch reversibly from a deactivated state to an activated state upon the application of activated or deactivated means, respectively. This means may be an electrical potential, the presence of UV rays, temperature or a gas.

The Applicant has demonstrated that an optical article comprising a columnar micro- or nano-structured coating according to the invention gives the possibility to manage the intensity of the transmitted light as a function of the angle of incidence.

Especially, thanks to the orientation of the micro- or nano-columns and the absorbing properties of the core and/or the upper layer of said columns, the optical article comprises at least an absorptive region on its surface that is more absorptive than the others according to the directionality of light. In addition, this at least one absorptive region may be made according to the desired absorbing effect.

In particular, the absorption will be minimal in the direction parallel to the micro- or nano-columns. Thus, when the micro- or nano-columns covering a main surface of an optical article are pointed to the left, the light transmission of the columnar micro- or nano-structured coating is maximal to the left and minimal to the right due to an increase in absorption. On the contrary, when the micro- or nano-columns are pointed to the right, the light transmission of the columnar micro- or nano-structured coating is maximal to the right and minimal to left due to an increase in absorption. In addition, when the micro- or nano-columns are straight (perpendicular or almost perpendicular the main face of the substrate), the light transmission of the columnar micro- or nano-structured coating is maximal when at normal incidence (straight orientation) and decreases both on the left and on the right regions of the columnar micro- or nano-structure due to an increase in absorption.

This specific effect enables to obtain optical articles, such as ophthalmic lenses (spectacle lenses or sunglasses) for which it is preferable to manage undesirable light coming from many directions.

For instance, such ophthalmic lenses may be used by a driver who does not want to be blinded by oncoming traffic, such as car lights coming from the opposite direction. In the present case, it is suitable that the micro- or nano-columns are straight so as to improve the absorption on the right and on the left of the optical article and to avoid being blinded by car light coming from the left or right of the driver.

The optical article according to the invention is also suitable for an elderly person that is sensitive to light and is blinded at home by the many sources of light, for example after a cataract surgery, and who would not accept to have tinted lenses for cosmetic preference. In the present case, it is suitable that the micro- or nano-columns are also straight so as to improve the absorption on the right and on the left of the optical article.

Also, the optical article may be sunglasses adapted to block more light coming from the sun that is high in the sky while looking directly ahead (the micro- or nano-columns covering a main surface of an optical article are pointed to the bottom).

Therefore, the optical article according to the invention may be useful and adapted for many situations according to the desired effect for the wearer of the optical article.

In addition, the properties of the micro- or nano-columns such as a predetermined angle of the columns relative to a mean plane defined by the substrate, a porosity of the constitutive material of said micro- or nano-columns, a height of said micro- or nano-columns, may be controlled to maximize a change in transmission or reflection of incident light through the optical article as a function of the angle of incidence of light.

The columns of the micro- or nano-structured coating of the optical article according to the invention may be well-organized, for instance the spatial position of the columns on the substrate may present a geometrical regularity. The columns of the micro- or nano-structured coating of the optical article according to the invention may be homogeneous in shape, in size, in height, and/or in thickness. The term "homogeneous" in relation to a property of the columns means that the value of said property for at least 50%, at least 75%, at least 80%, at least 90% or at least 95% of the columns is in the range of ±30%, ±20%, ±10%, or ±5% around the mean value of said property for all columns.

Such homogeneity may be obtained by the use of GLAD deposition technique for the column core.

Said organization and/or homogeneity will help improving the angular selectivity of the optical article according to the invention.

Generally speaking, the columnar micro- or nano-structured coating of the optical article according to the invention, may be deposited onto any substrate, and preferably onto organic lens substrates, for example a thermoplastic or thermosetting plastic material.

Thermoplastic may be selected from, for instance: polyamides; polyimide; polysulfones; polycarbonates and copolymers thereof; poly(ethylene terephtalate) and polymethylmethacrylate (PMMA).

Thermoset materials may be selected from, for instance: cycloolefin copolymers such as ethylene/norbornene or ethylene/cyclopentadiene copolymers; homo- and copolymers of allyl carbonates of linear or branched aliphatic or aromatic polyols, such as homopolymers of diethylene glycol bis(allyl carbonate) (CR 39®); homo- and copolymers of (meth)acrylic acid and esters thereof, which may be derived from bisphenol A; polymer and copolymer of thio(meth)acrylic acid and esters thereof, polymer and copolymer of allyl esters which may be derived from Bisphenol A or phtalic acids and allyl aromatics such as styrene, polymer and copolymer of urethane and thiourethane, polymer and copolymer of epoxy, and polymer and copolymer of sulphide, disulfide and episulfide, and combinations thereof.

Homopolymers of diethylene glycol bis(allyl carbonate) (CR 39®), allylic and (meth)acrylic copolymers, having a refractive index between 1.54 and 1.58, are preferred.

As used herein, a (co)polymer is intended to mean a copolymer or a polymer. As used herein, a (meth)acrylate is intended to mean an acrylate or a methacrylate. As used herein, a polycarbonate (PC) is intended to mean either homopolycarbonates or copolycarbonates and block copolycarbonates.

Particularly recommended substrates include those substrates obtained through (co)polymerization of the diethyleneglycol bis-allyl-carbonate, marketed, for example, under the trade name CR-39® by the PPG Industries company (ORMA® lenses, ESSILOR), or through polymerization of the thio(meth)acrylate monomers, such as those described in the application of the French patent FR 2 734 827. The substrates may be obtained through polymerization of the above monomer combinations, or may further comprise mixtures of such polymers and (co)polymers.

Prior to depositing the antireflective coating onto the optionally coated substrate, for example with an abrasion-resistant layer and/or a scratch-resistant coating or with a sub-layer, the surface of said optionally coated substrate is usually submitted to a physical or chemical surface activating treatment, so as to reinforce the adhesion of the antireflective coating. Such pre-treatment is generally conducted under vacuum. It may be a bombardment with energetic and/or reactive species, for example with an ion beam ("Ion Pre-Cleaning" or "IPC") or with an electron beam, a corona discharge treatment, an ion spallation treatment, an ultraviolet treatment or a plasma-mediated treatment under vacuum, generally using an oxygen or an argon plasma. It may also be an acid or basic treatment and/or a solvent-based treatment (water, hydrogen peroxide or any organic solvent).

In general, these substrates are transparent in the visible region ranging from 380 to 780 nm along at least one incidence angle.

However, alternatively, these substrates can be put in a state where they are transparent at least in a part of the visible range ranging from 380 to 780 nm along at least one angle of incidence. For that purpose, the substrate may comprise an activation or deactivation means, such as a chromogenic material. The application of this activation or deactivation means enables to reversibly switch the substrate from a deactivated state to an activated state, wherein it is transparent in one of these states in a part of the visible range ranging from 380 to 780 nm along at least one angle of incidence. For instance, the document U.S. Pat. No. 5,359,444 describes such substrates that can be put in a state where they are transparent at least in a part of the visible range ranging from 380 to 780 nm along at least one angle of incidence.

As mentioned above, the columnar micro- or nano-structured coating according to the invention has different characteristics that can be adapted to provide a change in transmission or reflection of absorption of incident light through the optical article as a function of the angle of incidence of light.

These characteristics are for instance the porosity of columns (void between the columns related to the porosity of the material(s) forming the micro- or nano-structured coating), the diameter and height of the columns, the angle of the columns beta "β" defined between the columns and the main surface of the substrate that is coated with the columnar micro- or nano-structured coating.

In particular, the porosity is equal to or higher than 30%, preferably equal to or higher than 45%, especially ranging from 75 to 85%.

As used herein, porosity means the volume of voids between columns per a unit volume of columnar micro- or nano-structured coating.

In general, the porosity of columns is measured by ellipsometry using an anisotropic-Bruggeman effective medium approximation (EMA) model assuming a mix of void and needle-like columns of deposited material such as described in the publication of G. W. Mbise et al., *J. Phys. D: Appl. Phys.* 30 (1997) 2103.

Especially, the measurement is made as follows: the Mueller matrix parameters of the samples are acquired at four angles of incidence (45°, 55°, 65° and 75°) using a RC2 ellipsometer from J. A. Woollam Co. and analyzed using the CompleteEase software. During the modeling phase, the substrate is represented using a simple Cauchy model whereas the columns are modeled by a more complex layer comprising an anisotropic-Bruggeman effective medium approximation where anisotropy and porosity are taken into account and fitted.

The Applicant has indeed discovered that a porosity equal to or higher than 30% enables to improve the light transmission or absorption according to the directionality of the light. Indeed, a more porous coating allows for an increase in the maximum transmission while maintaining a comparable angular selectivity.

Preferably, the columns have a height ranging from 50 to 1000 nm, preferably ranging from 200 to 300 nm.

As used herein, a range from 50 to 1000 nm includes the followings values and any intervals among them: 50; 60; 70; 80; 90; 100; 110; 120; 130; 140; 150; 160; 170; 180; 190; 200; 250; 300; 350; 400; 450; 500; 550; 600; 650; 700; 750; 800; 850; 900; 950; 1000.

The height of the columns enables to tune the selectivity of the light absorption as function of the directionality of the light spectrum and depends on the desired effect/application.

According to the invention, the columns have elongated form and the height of the columns refers to the distance between the bottom of the columns that is the closest from the main surface of the substrate and the top of the columns.

In addition, the orientation of the columns with respect to the main surface of the optical article that is coated with the columnar micro- or nano-structured coating may also be controlled.

Especially, the angle beta 13 is ranging from 0 to 50°.

As used herein, a range from 0 to 50° includes the followings values and any intervals between them: 0; 1; 2; 3; 4; 5; 6; 7; 8; 9; 10; 11; 12; 13; 14; 15; 16; 17; 18; 19; 20; 21; 22; 23; 24; 25; 26; 27; 28; 29; 30; 31; 32; 33; 34; 35; 36; 37; 38; 39; 40; 41; 42; 43; 44; 45; 46; 47; 48; 49; 50.

In addition, the at least one main face of the substrate contains at least a predetermined pattern covered with the columnar micro- or nano-structured coating. Hence, the array of contiguous columns forming the columnar micro- or nano-structured coating may be placed onto the substrate according to a specific pattern.

The arrangement of the pattern can be a combination of various random or periodical shapes having same or different size, symmetrically (e.g. square or hexagonal patterns), asymmetrically arranged or randomly positioned.

Different structured surfaces can be formed based on the combination of all these features.

Generally, nanosphere lithography may be used to generate a hexagonal compact array of nanospheres. The latter can then be plasma treated to reduce their size and serve as a seed layer for column position and column diameter control. Any other means of nanostructuring such as nanoimprint lithography, self-assembled block copolymers, ion beam surface treatments and others may also allow for the generation of effective seed layers.

For instance, to obtain 80% porosity, a square lattice may be used.

A simplified calculation of the thickness and the spacing would go as follows: taking a period of 1 unit would mean that the columns would be 0.45 unit thick and be separated by 0.55 units. The calculation can be made taking the square root of (1-porosity) which is the square root of 20% that would give 0.45 units. In that example, if the period is 200 nm, that would mean columns that are 90 nm thick and separated by 110 nm. That would lead to a porosity of approximately 80%. The same type calculation can be done for any lattice that one would like to use.

These techniques are well-known from the skilled person and would therefore not be further described in the present application.

Preferably, the columnar array is a periodical array.

The description of the columnar micro- or nano-structured coating will be described in more details below.

As previously mentioned, the columnar micro- or nano-structured coating comprises an array of columns comprising each a core and an upper layer covering said core.

Especially, the core and the upper layer are structurally and/or chemically different.

In addition, the core and/or the upper layer have light absorbing properties or can be put in a state where they have light absorbing properties with an extinction coefficient "k" equal to or higher than $10^{-2}$ in at least a part of the light spectrum ranging from 250 to 2500 nm. Indeed, according to the invention, at least one among the core and the upper layer has absorbing properties.

Preferably, the extinction coefficient "k" of said the core and/or upper layer is equal to or higher than $10^{-2}$, especially equal to or higher than 10-1 in at least a part of the light spectrum ranging from 250 to 2500 nm. In addition, the extinction coefficient "k" may be equal to and lower than 10, such as equal to or lower than 5 in at least a part of the light spectrum ranging from 250 to 2500 nm.

According to different embodiments of the invention, the core and/or the upper layer of the columns may have light absorbing properties or can be put in a state where they have light absorbing properties.

It is not necessary that both the core and the upper layer have or may have absorbing properties. However, one of them has absorbing properties or can be put in a state where it has absorbing properties.

In particular, according to a first embodiment of the invention, the core and/or the upper layer have permanent light absorbing properties with an extension coefficient "k" (related to the absorption coefficient α from Beer-Lambert's law) equal to or higher than $10^{-2}$ at least in the visible range ranging from 380 to 780 nm, that is to say, the core and/or the upper layer do not need to be put in an activated state so as to have absorbing properties.

According to this first embodiment, the core and/or the upper layer may comprise one or more substoichiometric oxides, such as the substoichiometric oxides of $ZrO_2$, $TiO_2$, SiO, $SiO_2$, $Fe_2O_3$, $Al_2O_3$ and/or $Ta_2O_5$ and/or substoichiometric nitrides, such as the substoichiometric nitrides of $Si_3N_4$ or substoichiometric fluorides, such as the substoichiometric fluorides of $MgF_2$. Indeed, substoichiometric oxides have slight absorbing properties.

Also according to this first embodiment, the core and/or the upper layer may have both conducting properties (high k values) and absorbing properties. Especially, they may comprise one or more materials selected from: diamond like carbon DLC, graphene/graphite, metals, such as Au, Al, Ag, Cu, Ti, Cr; conductive nitrides like TiN, ZrN, TaN; semiconductors, doped or not, such as Si, Ge, GaAs; or transparent conductive oxides such as ITO, $SnO_2$, AZO. Indeed, it is indeed known that materials having conducting properties are partially absorbing.

According to a second embodiment of the invention, the core and/or the upper layer can be put in a state where they have light absorbing properties with an extension coefficient "k" equal to or higher than $10^{-2}$ at least in a part of the visible range ranging from 380 to 780 nm and are configured to reversibly switch from a deactivated state to an activated state upon the application of activation or deactivation means, respectively.

Especially for this second embodiment, the core and/or the upper layer comprise(s) at least one chromogenic stack, such as an electrochromic stack, a photochromic stack, a thermochromic stack or a gasochromic stack. Hence, the activation or deactivation means may be for instance an electrical potential, UV rays, temperature or a gas.

Indeed, as it is known, the electrochromic stack can be reversibly switched from a deactivated state to an activated state upon the application of an electrical potential, the photochromic stack can be reversibly switched from a deactivated state to an activated state upon the application of predetermined UV value, the thermochromic stack can be reversibly switched from a deactivated state to an activated state upon the application of an predetermined temperature and the gasochromic stack can be reversibly switched from a deactivated state to an activated state upon the application of predetermined gas.

For instance, the electrochromic (EC) stack comprises at least five ceramic layers disposed successively on each other, preferably each of the at least five ceramic layers is an oxide.

In general, the EC stack comprises a first and a second transparent conductive electrode layers (TCO layers), and the following layers placed between said first and a second transparent conductive electrode layers: one electrochromic layer (EC layer), one ion reservoir layer (IR layer) and one dielectric spacer layer (DS layer—electrolyte), said DS layer being placed between the EC layer and the IR layer.

Preferably, the EC stack comprises the following stack:
first TCO layer/EC layer/DS layer/IR layer/second TCO layer; or
first TCO layer/IR layer/DS layer/EC layer/second TCO layer.

For instance, the first TCO layer and the second TCO layer comprise one or more metal oxides selected from semiconductor oxides, such as $In_2O_3$:Sn or indium tin oxide (ITO), $SnO_2$, Au, Ag, Cu and are preferably ITO layers.

In general, the ITO (tin doped indium oxide) layer is composed of 10% of tin oxide and 90% of indium oxide by weight.

The EC layer may comprise one or more cathodic EC materials, such as $WO_3$, $TiO_2$, $Nb_2O_5$, $MoO_3$ and $Ta_2O_5$, $V_2O_5$, $TiO_x$, and is preferably a $WO_3$ layer, or one or more anodic materials, such as NiO, $IrO_2$, $Cr_2O_5$, $MnO_2$, $FeO_2$, $CoO_2$, $V_2O_5$, and is preferably a NiO layer. Generally, the EC layer may comprise a cathodic EC material, such as $WO_3$.

In general, the EC layer has a thickness ranging from 10 to 1000 nm, preferably ranging from 50 to 300 nm, and typically ranging from 20 to 190 nm.

The DS layer may comprise one or more oxide materials selected from $Ta_2O_5$, $SiO_2$, $Al_2O_3$, $TiO_2$, $ZrO_2$, $Nb_2O_5$, $Cr_2O_3$, $Sb_2O_5$, $LiNbO_3$, $LiBO_2$, $LiTaO_3$ and are preferably $Ta_2O_5$ or $SiO_2$.

In general, the DS layer has a thickness ranging from 10 to 1000 nm, preferably ranging from 50 to 300 nm, and for instance ranging from 20 to 190 nm.

The IR layer that may be suitable according to the invention comprises one or more anodic materials, such as $ZrO_2$, NiO, $IrO_2$, $Cr_2O_5$, $MnO_2$, $FeO_2$, $CoO_2$, $V_2O_5$ and is preferably a NiO layer.

In general, the IR layer has a thickness ranging from 10 to 1000 nm, preferably ranging from 50 to 300 nm, and in particular ranging from 20 to 190 nm.

Unless stated otherwise, all thicknesses disclosed in the present application relate to physical thicknesses.

Advantageously, the EC layer forms the core of the columns and the DS layer or the second TCO layer forms the upper layer of the columns.

The photochromic stack may comprise for instance oxygen-containing yttrium hydride such as described in the publication of T. Mongstad, C. Platzer-Björkman, J. P. Maehlen, L. P. A. Mooij, Y. Pivak, B. Dam, E. S. Marstein, B. C. Hauback, S. Z. Karazhanov "A new thin film photochromic material: oxygen-containing yttrium hydride", Sol. Energy Mater. Sol. Cells, 95 (2011), pp. 3596-3599.

The thermochromic stack may comprise for instance vanadium dioxide such as described in the publication of S. M. Babulanam, T. S. Eriksson, G. A. Niklasson, C. G. Granqvist, Thermochromic $VO_2$ films for energy-efficient windows, Solar Energy Materials, Volume 16, Issue 5, 1987, Pages 347-363. The gasochromic stack that may be suitable according to the invention may correspond to the one described in the publication of Dezeng Li, Guangming Wu, Guohua Gao, Jun Shen, and Fuqiang Huang, "Ultrafast Coloring-Bleaching Performance of Nanoporous $WO_3$—$SiO_2$ Gasochromic Films Doped with Pd Catalyst", *ACS Applied Materials & Interfaces* 2011 3 (12), 4573-4579.

In one preferred embodiment, the core is transparent and the upper layer has light absorbing properties or can be put in a state where it has light absorbing properties with an extension coefficient "k" equal to or higher than $10^{-2}$ in at least a part of the light spectrum ranging from 250 to 2500 nm, preferably from 250 to 1400 nm.

Preferably, the core comprises one or more stoichiometric oxides such as $SiO_2$, $WO_3$, $TiO_2$, $ZrO_2$, $Al_2O_3$ $Ta_2O_5$, or nitrides such as $Si_3N_4$, or fluorides, such as $MgF_2$ or a mixture of organic-inorganic materials, such as a metal oxide with an organosilicon compound (SiOCH).

The organosilicon compound may correspond for instance to the organic compound A such as described in the patent application WO 2017/194871, incorporated herein by reference.

In a preferred embodiment, the core and/or the upper layer has (have) a high refractive index that is higher than or equal to 1.8, preferably higher than or equal to 1.9, and especially higher than or equal to 2 or has (have) a medium refractive index that is lower than 1.8, preferably lower than or equal to 1.7 and especially lower than or equal to 1.6.

The core and/or the upper layer has (have) a high refractive index may be generally comprised of one or more metal oxides such as, without limitation, $ZrO_2$, $TiO_2$, $WO_3$, $Al_2O_3$, $Nd_2O_3$, $HfO_2$, $Pr_2O_3$, $PrTiO_3$, $La_2O_3$, $Nb_2O_5$, $Y_2O_3$, $In_2O_3$, $Sn_2O_3$ and/or $Ta_2O_5$ and mixtures thereof.

The core and/or the upper layer has (have) a high refractive index may also be generally comprised of one or more metal oxides or fluorides such as, without limitation $SiO_2$, $MgF_2$, $ZrF_4$, $Al_2O_3$, $AlF_3$, SiOF and mixtures thereof.

Preferably, the upper layer has a thickness ranging from 1 to 500 nm, especially ranging from 5 to 300 and typically ranging from 10 to 200.

Generally, the columnar micro- or nano-structured coating total thickness is lower than 1000 nm, preferably lower than or equal to 500 nm, more preferably lower than or equal to 400 nm and even more preferably lower than or equal to 300 nm. The columnar micro- or nano-structured coating total thickness is generally higher than 20 nm, preferably higher than 100 nm.

As used herein, a range from 20 to 1000 nm includes the followings values and any intervals among them: 20; 21; 22; 23; 24; 25; 26; 27; 28; 29; 30; 35; 40; 45; 50; 60; 70; 80; 90; 100; 110; 120; 130; 140; 150; 160; 170; 180; 190; 200; 250; 300; 350; 400; 450; 500; 550; 600; 650; 700; 750; 800; 850; 900; 950; 1000.

In an embodiment of the invention, the upper layer is absent from the columns head, meaning that the parts of the columns core that are situated less than a predefined distance from the substrate main face are covered with the upper layer, when the parts of the columns core that are situated at the predefined distance or more than the predefined distance of the substrate main face are not covered by the upper layer. The predefined distance may correspond to the column core height (especially when the column is straight) or to the shortest distance between the substrate main face and the lowest part of the column core top section (especially when the column is tilted). In a specific embodiment, the columns are cylindrical straight columns, and the upper layer covers only the cylindrical walls of the columns.

The absence of upper layer from the columns head enhances angular selectivity, which is the difference in transmission between incident light coming in a direction parallel to the column, and incident light coming in a direction secant to the column.

The absence of upper layer from the columns head can be obtained either by adaptation of the step of deposition of the upper layer, or by specific removal of the upper layer in the desired zones after its deposition step.

In one embodiment of the present invention, the antireflective coating is deposited onto a sub-layer. It should be noted that such sub-layer does not belong to the columnar micro- or nano-structured coating.

As used herein, a columnar micro- or nano-structured coating sub-layer or adhesion layer is intended to mean a relatively thick coating, used in order to improve the mechanical properties such as the abrasion resistance and/or the scratch resistance of said coating and/or so as to reinforce its adhesion to the substrate or to the underlying coating.

Because of its relatively high thickness, the sub-layer does not generally take part to the reflection/transmission optical activity, especially when it has a refractive index close to that of the underlying coating (which is generally the anti-abrasion and anti-scratch coating) or to that of the substrate, if the sub-layer is directly deposited onto the substrate.

The sub-layer should have a thickness that is sufficient for promoting the abrasion resistance of the columnar micro- or nano-structured coating, but preferably not to such an extent that a light absorption could be caused, which, depending on the sub-layer nature, could significantly reduce the relative transmission factor $\tau_v$. Its thickness is generally lower than 300 nm, more preferably lower than 200 nm, and is generally higher than 90 nm, more preferably higher than 100 nm.

The sub-layer preferably comprises a $SiO_2$-based layer, this layer comprising preferably at least 80% by weight of silica, more preferably at least 90% by weight of silica, relative to the layer total weight, and even more preferably consists in a silica layer. The thickness of such silica-based layer is generally lower than 300 nm, more preferably lower than 200 nm, and is generally higher than 90 nm, more preferably higher than 100 nm.

In another embodiment, this $SiO_2$-based layer is a silica layer doped with alumina, in amounts such as defined hereabove, preferably consists in a silica layer doped with alumina.

In a particular embodiment, the sub-layer consists in a $SiO_2$ layer.

A sub-layer of the monolayer type will be preferably used. However, the sub-layer may be laminated (multilayered), especially when the sub-layer and the underlying coating (or the substrate, if the sub-layer is deposited directly onto the substrate) have a substantially different refractive index. This applies especially when the underlying coating, which is generally an anti-abrasion and/or anti-scratch coating, or the substrate, have a high refractive index, i.a. a refractive index higher than or equal to 1,55, preferably higher than or equal to 1,57.

In this case, the sub-layer may comprise, in addition to a 90-300 nm-thick layer, called the main layer, preferably at most three additional layers, more preferably at most two additional layers, interleaved between the optionally coated substrate and such 90-300 nm-thick layer, which is generally a silica-based layer. These additional layers are preferably thin layers, which function aims at limiting the reflections at the sub-layer/underlying coating interface or sub-layer/substrate interface, as appropriate.

A multilayered sub-layer preferably comprises, in addition to the main layer, a layer with a high refractive index and with a thickness lower than or equal to 80 nm, more preferably lower than or equal to 50 nm and most preferably lower than or equal to 30 nm. Such layer with a high refractive index is directly contacting the substrate with a high refractive index or the underlying coating with a high refractive index, as appropriate. Of course, this embodiment may be used even if the substrate (or the underlying coating) has a refractive index lower than 1.55.

As an alternative, the sub-layer comprises, in addition to the main layer and to the previously mentioned layer with a high refractive index, a layer made of a $SiO_2$-based material (that is to say comprising preferably at least 80% by weight of silica) with a refractive index lower than or equal to 1,55, preferably lower than or equal to 1,52, more preferably lower than or equal to 1,50, and with a thickness lower than or equal to 80 nm, more preferably lower than or equal to 50 nm and even more preferably lower than or equal to 30 nm, onto which is deposited said layer with a high refractive index. Typically, in this instance, the sub-layer comprises, deposited in this order onto the optionally coated substrate, a 25 nm-thick $SiO_2$ layer, a 10 nm-thick $ZrO_2$ or $Ta_2O_5$ layer and thereafter the sub-layer main layer.

The optical article of the invention may be made antistatic, that is to say not to retain and/or develop a substantial static charge, by incorporating at least one charge dissipating conductive layer into the stack present on the surface of the article.

The ability for a glass to evacuate a static charge obtained after rubbing with a piece of cloth or using any other procedure to generate a static charge (charge applied by corona . . . ) may be quantified by measuring the time it takes for said charge to dissipate. Thus, antistatic glasses have a discharge time of about a few hundred milliseconds, preferably 500 ms or less, whereas it is of about several tens of seconds for a static glass. In the present application, discharge times are measured according to the method exposed in the French application FR 2 943 798.

As used herein, an "electrically conductive layer" or an "antistatic layer" is intended to mean a layer which, due to its presence on the surface of a non-antistatic substrate (i.e. having a discharge time higher than 500 ms), enables to have a discharge time of 500 ms or less after a static charge has been applied onto the surface thereof.

The electrically conductive layer may be located in various places in the stack, generally in or in contact with the columnar micro- or nano-structured coating, provided the reflection/transmission properties thereof are not affected.

The electrically conductive layer should be thin enough not to alter significantly the transparency of the columnar micro- or nano-structured coating. The electrically conductive layer is preferably made from an electrically conductive and highly transparent material, generally an optionally doped metal oxide. In this case, the thickness thereof preferably varies from 1 to 15 nm, more preferably from 1 to 10 nm. Preferably, the electrically conductive layer comprises an optionally doped metal oxide, selected from indium, tin, zinc oxides and mixtures thereof. Tin-indium oxide ($In_2O_3$:Sn, tin-doped indium oxide), aluminum-doped zinc oxide (ZnO:Al), indium oxide ($In_2O_3$) and tin oxide ($SnO_2$) are preferred. In a most preferred embodiment, the electrically conductive and optically transparent layer is an indium-tin oxide layer, noted ITO layer or a tin oxide layer.

The columnar micro- or nano-structured coating may be deposited directly onto a bare substrate. In some applications, it is preferred for the main face of the substrate to be coated with one or more functional coatings prior to depositing the micro- or nano-structured coating of the invention. These functional coatings traditionally used in optics may be, without limitation, an impact-resistant primer layer, an abrasion-resistant coating and/or a scratch-resistant coating, a polarizing coating, a photochromic coating or a tinted coating.

Generally, the front and/or rear main face of the substrate, onto which a columnar micro- or nano-structured coating will be deposited, is coated with an impact-resistant primer layer, with an anti-abrasion and/or anti-scratch coating, or with an impact-resistant primer layer coated with an anti-abrasion and/or anti-scratch coating.

The micro- or nano-structured coating of the invention is preferably deposited onto an anti-abrasion and/or anti-scratch coating.

Alternatively, the anti-abrasion and/or anti-scratch coating may be coated onto the micro- or nano-structured coating of the invention.

In general, the micro- or nano-structured coating of the invention is in direct contact with the anti-abrasion and/or anti-scratch coating.

The anti-abrasion and/or scratch-resistant coating may be any layer traditionally used as an anti-abrasion and/or anti-scratch coating in the field of ophthalmic lenses.

The anti-abrasion and/or scratch-resistant coatings are preferably hard coatings based on poly(meth)acrylates or silanes, generally comprising one or more mineral fillers intended to increase the hardness and/or the refractive index of the coating once cured.

Hard anti-abrasion and/or scratch-resistant coatings are preferably prepared from compositions comprising at least one alkoxysilane and/or a hydrolyzate thereof, obtained for example through hydrolysis with a hydrochloric acid solution and optionally condensation and/or curing catalysts.

Suitable coatings, that are recommended for the present invention include coatings based on epoxysilane hydrolyzates such as those described in the patents FR 2 702 486 (EP 0 614 957), US 4 211 823 and US 5 015 523.

A preferred anti-abrasion and/or scratch-resistant coating composition is the one disclosed in the patent FR 2 702 486, in the name of the applicant. It comprises a hydrolyzate of epoxy trialkoxysilane and dialkyl dialkoxysilane, colloidal silica and a catalytic amount of an aluminium-based curing catalyst such as aluminium acetylacetonate, the rest being essentially composed of solvents traditionally used for formulating such compositions. Preferably, the hydrolyzate used is a hydrolyzate of γ-glycidoxypropyltrimethoxysilane (GLYMO) and dimethyldiethoxysilane (DMDES).

The anti-abrasion and/or scratch-resistant coating composition may be deposited onto the main face of the substrate by dip- or spin-coating. It is then cured by a suitable method (preferably using heat or ultraviolet radiation).

The thickness of the anti-abrasion and/or scratch-resistant coating does generally vary from 2 to 10 μm, preferably from 3 to 5 μm.

Prior to depositing the abrasion-resistant coating and/or the scratch-resistant coating, it is possible to apply onto the substrate a primer coating to improve the impact resistance and/or the adhesion of the subsequent layers in the final product. This coating may be any impact-resistant primer layer traditionally used for articles in a transparent polymer material, such as ophthalmic lenses.

Preferred primer compositions include compositions based on thermoplastic polyurethanes, such as those described in the Japanese patents JP 63-141001 and JP 63-87223, poly(meth)acrylic primer compositions, such as those described in the U.S. Pat. No. 5,015,523, compositions based on thermosetting polyurethanes, such as those described in the patent EP 0 404 111 and compositions based on poly(meth)acrylic latexes or polyurethane type latexes, such as those described in the U.S. Pat. No. 5,316,791 and EP 0 680 492.

Preferred primer compositions are compositions based on polyurethanes and compositions based on latexes, especially polyurethane type latexes optionally containing polyester units.

Commercially available primer compositions to be suitably used in the present invention include compositions such as Witcobond® 232, Witcobond® 234, Witcobond® 240, Witcobond® 242, Neorez® R-962, Neorez® R-972, Neorez® R-986 and Neorez® R-9603.

Combinations of such latexes may also be used in the primer, especially of polyurethane type latexes and poly(meth)acrylic latexes.

Such primer compositions may be deposited onto the article faces by dip- or spin-coating, thereafter be dried at a temperature of at least 70° C. and up to 100° C., preferably of about 90° C., for a time period ranging from 2 minutes to 2 hours, generally of about 15 minutes, to form primer layers having thicknesses, after curing, of from 0.2 to 2.5 μm, preferably of from 0.5 to 1.5 μm.

The optical article according to the invention may also comprise coatings formed on the micro- or nano-structured coating and capable of modifying the surface properties thereof, such as hydrophobic and/or oleophobic coatings (antifouling top coat). These coatings are preferably deposited onto the outer layer of the micro- or nano-structured coating. As a rule, their thickness is lower than or equal to 10 nm, does preferably range from 1 to 10 nm, more preferably from 1 to 5 nm.

There are generally coatings of the fluorosilane or fluorosilazane type. They may be obtained by depositing a fluorosilane or fluorosilazane precursor, comprising preferably at least two hydrolyzable groups per molecule. Fluorosilane precursors preferably comprise fluoropolyether moieties and more preferably perfluoropolyether moieties. These fluorosilanes are well known and are described, between others, in the U.S. Pat. Nos. 5,081,192, 5,763,061, 6,183,872, 5,739,639, 5,922,787, 6,337,235, 6,277,485 and EP 0 933 377.

A preferred hydrophobic and/or oleophobic coating composition is marketed by Shin-Etsu Chemical under the trade name KP 801M®. Another preferred hydrophobic and/or oleophobic coating composition is marketed by Daikin Industries under the trade name OPTOOL DSX®. It is a fluorinated resin comprising perfluoropropylene groups.

Instead of the hydrophobic coating, a hydrophilic coating may be used which provides antifog properties, or an antifog precursor coating which provides antifog properties when associated with a surfactant. Examples of such antifog precursor coatings are described in the patent application WO 2011/080472.

In addition, the optical article according to the invention may comprise a traditional antireflective (AR) coating. In general, a traditional AR coating has a mean light reflection factor in the visible region (380-780 nm) $R_v$ that is lower than or equal to 2.5%, preferably lower than or equal to 1.0%.

In the present application, the "mean light reflection factor", noted $R_v$, is such as defined in the ISO 13666:1998 Standard, and measured in accordance with the ISO 8980-4, i.e. this is the weighted spectral reflection average over the whole visible spectrum between 380 and 780 nm. $R_v$ is usually measured for an angle of incidence lower than 17°, typically of 15°, but can be evaluated for any angle of incidence.

Preferably, the AR coating comprises a stack of at least one layer with a high refractive index and of at least one layer with a low refractive index.

More preferably, it comprises at least two layers with a low refractive index (LI) and at least two layers with a high refractive index (HI). It is here a simple stack, since the layer total number in the AR coating is higher than or equal to 3, preferably higher than or equal to 4, and lower than or equal to 7, more preferably lower than or equal to 6, even more preferably lower than or equal to 5, and most preferably equal to 5 layers.

As used herein, a layer of the AR coating is defined as having a thickness higher than or equal to 1 nm. Thus, any layer having a thickness lower than 1 nm will not be considered when counting the number of layers in the antireflective coating. The sub-layer either is not considered when counting the number of layers of the antireflective coating.

HI layers and BI layers don't need to alternate with each other in the stack, although they also may. Two HI layers (or more) may be deposited onto each other, as well as two LI layers (or more) may be deposited onto each other.

In the present application, a layer of the traditional AR coating is said to be a layer with a high refractive index (HI) when its refractive index is higher than or equal to 1.5, preferably higher than or equal to 1.6, even more preferably higher than or equal to 1.7, even more preferably higher than or equal to 1.8 and most preferably higher than or equal to 1.9. Said HI layer preferably has a refractive index lower than 2.1. A layer of an antireflective coating is said to be a low refractive index layer (LI) when its refractive index is lower than 1.50, preferably lower than or equal to 1.48, more preferably lower than or equal to 1.47. Said LI layer preferably has a refractive index higher than 1.1. Unless otherwise specified, the refractive indexes referred to in the present application are expressed at 25° C. at a wavelength of 550 nm.

The HI layer of the traditional AR coating is a traditional high refractive index layer, that is well known in the art. It generally comprises one or more metal oxides such as, without limitation, zirconia ($ZrO_2$), titanium dioxide ($TiO_2$), alumina ($Al_2O_3$), tantalum pentoxide ($Ta_2O_5$), neodymium oxide ($Nd_2O_5$), praseodymium oxide ($Pr_2O_3$), praseodymium titanate ($PrTiO_3$), lanthanum oxide ($La_2O_3$), niobium oxide ($Nb_2O_5$), yttrium oxide ($Y_2O_3$). Optionally, the HI layers may further contain silica or other materials with a low refractive index, provided they have a refractive index higher than or equal to 1,5 as indicated hereabove. The preferred materials include $TiO_2$, $PrTiO_3$, $ZrO_2$, $Al_2O_3$, $Y_2O_3$ and mixtures thereof.

The LI layer is also well known and may comprise, without limitation, $SiO_2$, or a mixture of silica and alumina, especially silica doped with alumina, the latter contributing to increase the antireflective coating thermal resistance. The LI layer is preferably a layer comprising at least 80% by weight of silica, more preferably at least 90% by weight of silica, relative to the layer total weight, and even more preferably consists in a silica layer. Preferably, the LI layers in the antireflective coating are not $MgF_2$ layers.

Optionally, the LI layers may further contain materials with a high refractive index, provided the refractive index of the resulting layer is lower than 1.5.

The traditional AR coating outer layer is necessarily a silica-based layer, comprising preferably at least 80% by weight of silica, more preferably at least 90% by weight of silica (for example a silica layer doped with alumina), relative to the layer total weight, and even more preferably consists in a silica layer.

Generally, the HI layers have a physical thickness ranging from 10 to 120 nm, and the LI layers have a physical thickness ranging from 10 to 100 nm.

Generally, the traditional AR coating total thickness is lower than 1 micrometer, preferably lower than or equal to 800 nm, more preferably lower than or equal to 500 nm and even more preferably lower than or equal to 250 nm. The antireflective coating total thickness is generally higher than 100 nm, preferably higher than 150 nm.

Typically, an optical article, such as an ophthalmic lens according to the invention comprises a substrate that is successively coated on its rear face with an impact-resistant primer layer, an anti-abrasion and scratch-resistant layer, micro- or nano-structured coating according to the invention, a traditional AR coating with optionally a hydrophobic and/or oleophobic coating, or with a hydrophilic coating which provides antifog properties, or an antifog precursor coating.

The front face of the substrate of the optical article may be successively coated with an impact-resistant primer layer, an abrasion-resistant layer and/or a scratch-resistant layer, a traditional antireflective coating which may be, or not, an anti-UV, the columnar micro- or nano-structured coating, and with a hydrophobic and/or oleophobic coating.

Preferably, the front face of the substrate of the optical article may be successively coated with an optional impact-resistant primer layer, the columnar micro- or nano-structured coating, an optional abrasion-resistant layer and/or a scratch-resistant layer and a traditional AR coating.

The ophthalmic lens according to the invention is preferably an ophthalmic lens for spectacles (spectacle lens), or a blank for ophthalmic lenses. The lens may be tinted or not, be corrective, or not.

3—Method of Manufacturing an Optical Article

The present invention also relates to a method of manufacture of an optical article comprising a substrate with a front main face and with a rear main face, at least one of the main faces being coated with a columnar micro- or nano-structured coating, wherein the substrate and the optical article are transparent or can be put in a state where they are transparent in at least a part of the visible region ranging from 380 to 780 nm, along at least one incidence angle;

said columnar micro- or nano-structured coating comprises at least an array of columns comprising each a core and an upper layer covering said core, the core and the upper layer being structurally and/or chemically different and have light absorbing properties or can be put in a state where they have light absorbing properties with an extinction coefficient "k" equal to or higher than $10^{-2}$ in at least a part of the light spectrum ranging from 250 to 2500 nm;

the method comprising the following steps:

(a) depositing on the at least one main surface of the substrate, the core by physical directional deposition, preferably by glancing angle deposition (GLAD), sputtering, electron beam deposition, to create the array of columns;

(b) depositing, on the core of the columns, at least the upper layer by atomic layer deposition (ALD);

the parameters of the deposition of the core and of the upper layer being controlled so as to provide a change in transmission or reflection of incident light through the optical article as a function of the angle of incidence of light.

Of course, the characteristics of the optical article described above are reproduced here for the description of the method of manufacturing. The characteristics of the method of manufacturing described below are also suitable for the above-description of the optical article.

Especially, the core is deposited by physical directional deposition, preferably by glancing angle deposition (GLAD) that is a physical vapor deposition method.

The concept of oblique angle deposition (GLAD), described for example in U.S. Pat. Nos. 5,866,204 and 6,206,065, consists in modifying the direction of the flow of particles so that this flow reaches the surface of the substrate, not perpendicularly to this surface, but with an oblique angle α.

Hence, the substrate with a front main face and with a rear main face that has a surface with normal N, is exposed to the oblique incident vapor flow whose angle of incidence, defined in relation to the normal N, is a. As atoms in the vapor flow are deposited onto the substrate, film growth area atoms shadow adjacent regions, preventing deposition of vapor in these regions. Atoms in the vapor flow continue to be deposited in regions that are not shadowed, thus forming columns. These columns grow at the angler. (angle between the axis of the columns and the normal surface N of the substrate).

Oblique angle deposition is generally made at an angle α that is ranging from 0° to 90°, preferably ranging from 40 to 89.

According to a characteristic of the invention, the angle α can change during the deposition step (a).

In one embodiment, the deposition takes place while the substrate is rotating about an axis substantially orthogonal to the substrate surface. This embodiment enables for instance to obtain straight columns ($\beta=0°$). When the substrate is an ophthalmic lens, the aforementioned axis merges preferably with the optical axis of the lens.

In addition, properties of the columns such as angle $\beta$, angle $\alpha$, the porosity of the columns (such as defined above), the height of the columns may be controlled to maximize a change in transmission or reflection of incident light through the optical article as a function of the angle of incidence of light.

Especially, the porosity of the columns may be control by increasing the angle $\alpha$ which leads to a lower refractive index of the core and therefore increases its porosity. The porosity may also be lower when ion-assistance deposition is added to the method of manufacturing.

According to the invention, the upper layer is in direct contact to the core of the columns and is deposited by atomic layer deposition (ALD). This method is a type of self-limited chemical vapor deposition (CVD) where the reactions are limited to the surface of the object being coated.

The ALD process consists of sequential alternating pulses of gaseous chemical materials such as defined above (upper layer description) that react with the core of the columns. These individual gas-surface reactions are called 'half-reactions' and appropriately make up only part of the materials synthesis. During each half-reaction, the gaseous chemical material is pulsed into a chamber under vacuum (<1 Torr) for a designated amount of time to allow the gaseous chemical materials to fully react with the core surface through a self-limiting process that leaves no more than one monolayer at the surface. Subsequently, the chamber is purged with an inert carrier gas (typically $N_2$ or Ar) to remove any unreacted gaseous chemical materials or reaction by-products. This is then followed by the counter-reactant precursor pulse and purge ($TiCl_4$, $NH_3$) creating up to one layer of the desired material. This process is then cycled until the appropriate film thickness is achieved. Typically, ALD processes are conducted at modest temperatures (<350° C.). Plasma activation can be used during one or more of such steps (Plasma Atomic Layer Deposition "P-ALD" or Plasma-Enhanced Atomic Layer Deposition "PEALD" process) allowing to further reduce the deposition temperature.

The temperature range where the growth is saturated is referred to as the 'ALD temperature window'. Temperatures outside of the window generally result in poor growth rates and non-ALD type deposition due to effects such as slow reaction kinetics or precursor condensation (at low temperature) and thermal decomposition or rapid desorption of the precursor (at high temperature). In order to benefit from the many advantages of ALD, it is desirable to operate within the designated ALD window for each deposition process.

According to the invention, the temperature is preferably ranging from 20 to 400° C. and typically is ranging from 50 to 100° C.

As used herein, a range of temperatures from 20 to 400° C. includes the following values and any intervals between them: 20;25; 30; 35; 40; 45; 50; 55; 60; 65; 70; 75; 80; 85; 90; 95; 100; 110; 120; 130; 140; 150; 160; 170; 180; 190; 200; 210; 220; 230; 240; 250; 260; 270; 280; 290; 300; 310; 320; 340; 350; 360; 370; 380; 390; 400.

Especially, at step (b), a number of cycles is ranging from 10 to 1000 and preferably from 100 to 400.

Also, as used herein, a range from 10 to 1000 includes the following values and any intervals between them: 10; 20; 30; 40; 50; 60; 70; 80; 90; 100; 200; 300; 400; 500; 600; 700; 800; 900 and 1000.

According to an embodiment of the invention, step (a) of depositing on the at least one main surface of the substrate, the core by physical directional deposition, preferably by glancing angle deposition (GLAD), is performed with ion-beam assistance.

For instance, step (a) may be performed by ion-beam assisted GLAD.

The Applicant has indeed surprisingly discovered that ion bombardment leads to a different structure of the columns, making them more efficient at coloring upon charge insertion and removal. The Applicant has also discovered that ion-beam assistance enables to obtain columnar micro- or nano-structured coating that possesses enhanced mechanical performance without a significant impact on its columnar growth.

In particular, the method comprises a preliminary step which is:

(a0) patterning the main surface of the substrate that is intended to be coated with the micro- or nano-structured coating with a predetermined pattern (periodic or non-periodic) and performing step (a), i.e: depositing the core by physical directional deposition, preferably by glancing angle deposition (GLAD), sputtering, electron beam deposition, to create the array of contiguous columns.

Hence, the columnar micro-or- nano-structure will have a shape depending on the underlying predetermined pattern.

According to an embodiment, the method further comprises, after step (b), an additional step (c) of removal of part of the upper layer in at least one desired zone. As previously exposed, the upper layer may be removed in the zone corresponding to the columns head.

Step (c) may be performed by any appropriate technique in the art. For instance, the removal of step (c) may be performed by etching, preferably by dry etching, in particular by inductively coupled plasma reactive ion etching (ICPRIE).

EXAMPLE

1. General Procedures

The optical articles used in the examples comprise an inorganic 2-mm-thick B270 glass substrate (50 mm×50 mm) substrate, a refractive index of 1.52 (substrate commercialized by SCHOTT).

The front main face of these optical articles has been coated with the columnar micro- or nano-structured coating according to the invention.

When present, the ITO (tin doped indium oxide) layer is composed of 10% of indium oxide.

GLAD deposition was done as follows:

The core of the columns of the different tested optical article was deposited in a box coater (BoxerPro, Leybold Optics) by electron-beam evaporation (source HPE-6). A turbomolecular pump maintained a base pressure lower than $5×10^{-8}$ Torr and was monitored using a capacitive pressure gauge during deposition.

The material intended to be deposited (such as $SiO_2$, $WO_3$, etc.) so as to form the core of the columns were place on a custom-made substrate holder for the GLAD of samples (incidence angles of evaporated material relative to the substrate's normal a of 60°, 67°,77° and 87° (see FIG. 1) and on a spherical carrousel for non-GLAD reference samples ($\alpha=$) 0°.

The different GLAD substrate holders are subjected to different deposition rates as a function of the incidence angle of evaporated material a and distance from the source material, the working pressure and the ion bombardment flux.

As it is shown on FIG. 1, the e-beam source is at the bottom of the chamber and allows the deposition of many different materials. The substrate holder is on the left side of the figure. A motor is present and enables the rotation of the holder. By depositing on this substrate holder, a glancing angle deposition (GLAD) is created. The different positions on the substrate holder or angles (a) compared to the e-beam source give different nanostructure coating. In addition, by rotating the substrate holder at speeds high enough, straight columns may be obtained ($\beta 3=0$).

ALD deposition was done as follows:

The core of the columns was then functionalized with different thicknesses of titanium nitride (embodiment 1 illustrated hereafter) or silicon oxide (embodiment 2 illustrated hereafter) using atomic layer deposition (ALD) in a ALD-100LX system by Kurt J. Lesker. These different thicknesses were achieved using 400, 500 and 600 cycles of the ALD reaction. Titanium tetrachloride ($TiCl_4$) was used as a metal precursor and ammonia ($NH_3$) as a reducing agent in the thermal ALD reaction. Exposure to both $TiCl_4$ and $NH_3$ was pulsed for 20 ms followed by 1.2 s and 1.6 s of nitrogen purge after $TiCl_4$ and $NH_3$ respectively. These cycle times were previously optimized to yield saturated ALD growth with minimum process time.

The samples surface temperature was kept at 335° C. during deposition. This temperature was calibrated using a 5-point silicon thermocouple wafer and, it is thus expected that the B270 glass samples had lower surface temperature due to their greater thickness and lower thermal conductivity.

The growth per cycle (GPC) of the process, measured by variable angle spectroscopic ellipsometry, was determined to be 0.12±0.02 Å/cycle on native oxide for the 500 cycle samples. This equates to thicknesses of 4.8, 6.0 and 7.2 nm for 400, 500 and 600 cycles respectively. Physical thicknesses were also measured by transmission electron microscopy for the 500 and 600 cycle B270 glass samples.

2. Test Procedure and Results

The method for making optical articles comprises the step of introducing the substrate, a step of depositing the core of the columns by GLAD and depositing the upper layer by ALD at different cycles.

The following examples have been tested:

First embodiment: $SiO_2$-GLAD+TiN-ALD (see FIG. 2 and FIG. 3)

|  | Example 1 (tilted columns) | Example 2 (straight columns) |
| --- | --- | --- |
| Angle α | 87° | 87° with rotation |
| Angle β | 46° | 0° |
| Height of the columns (layer thickness) | 528 nm | 458 nm |
| Porosity of the core (%) | 70 | 70 |
| ALD deposition (number of cycles) | 0/400/500 or 600 | 0/400/500 or 600 |

These samples were produced by first depositing a GLAD coating on glass and then depositing a thin layer of TiN by atomic layer deposition (ALD). The latter technique consists in depositing atomic layers one by one on the whole available surface. In the case of GLAD coatings, the surface is the top and the sides of the nanocolumns. Therefore, all the sides are coated with an atomic layer of TiN for each cycle of this process. That means that after 500 cycles, one should expect a few tens of nm of TiN to cover evenly all of these nanocolumns.

Figure 2:
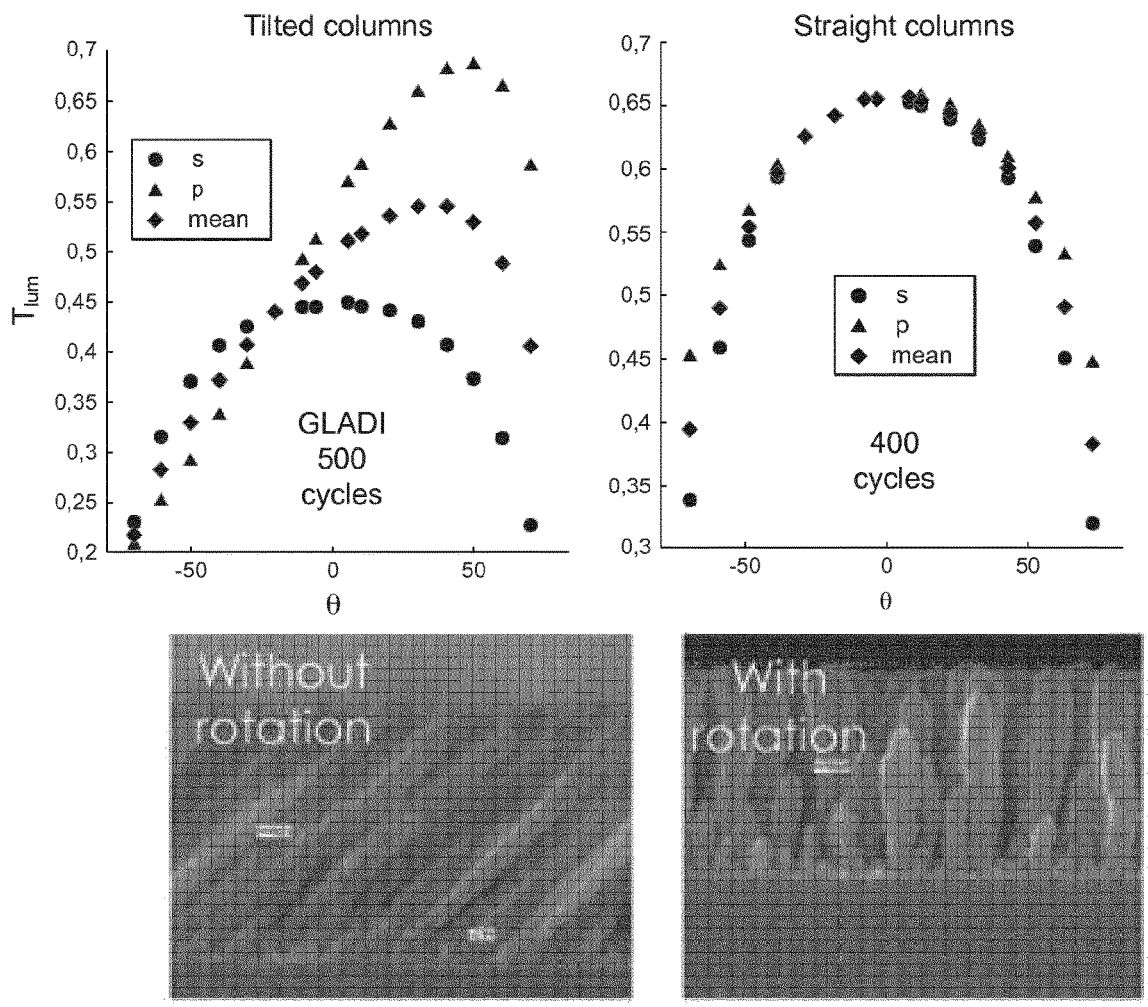
FIG. 2 shows the variation of the transmission as a function of the angle of incidence for two optical articles according to the invention (example 1 at 500 cycles of ALD and example 2 at 400 cycles of ALD for p-polarization light, s-polarized light and their mean) and the pictures obtained by scanning electron microscopy (SEM) on a JEOL JSM7600F instrument equipped with a field emission gun.

The result as shown on FIG. 2 is that with straight columns (example 2), transmission is varied from 70% to 35% based on the angle of incidence. Example 1 corresponds to the tilted columns where maximum transmission occurs at the angle beta of the nanocolumns, which is around 45 degrees. That allows the average (s and p polarization) luminous transmission to be varied from approximately 55% to 20%.

Figure 3:
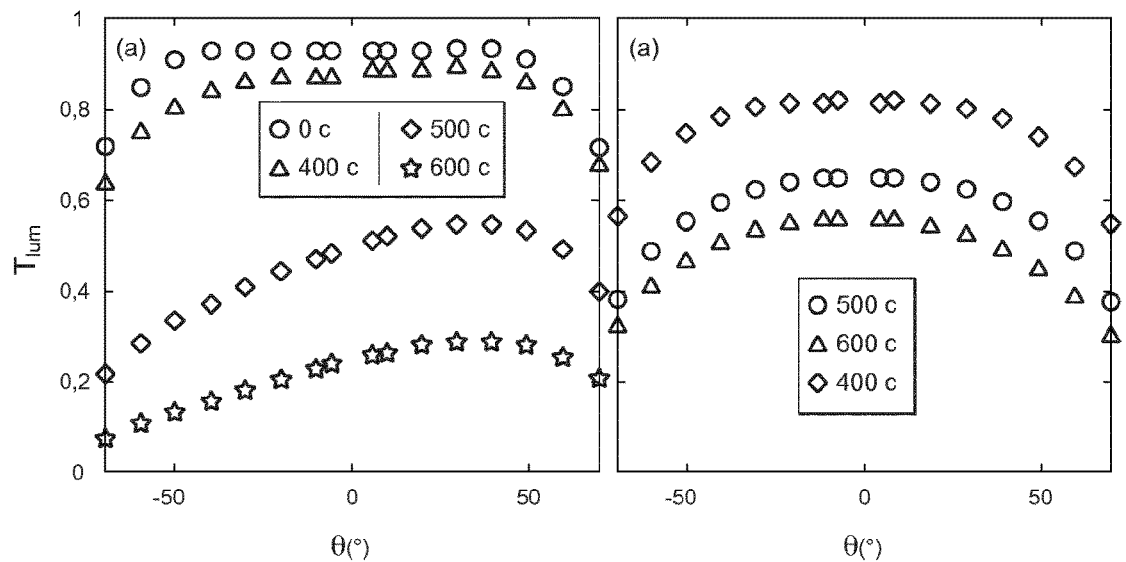
FIG. 3 shows the luminous transmittance as a function of the incidence angle for (a) the optical article according to example 1 and (b) the optical article according to example 2, coated with TiN after 0, 400, 500 and 600 cycles of ALD.
Figure 4:
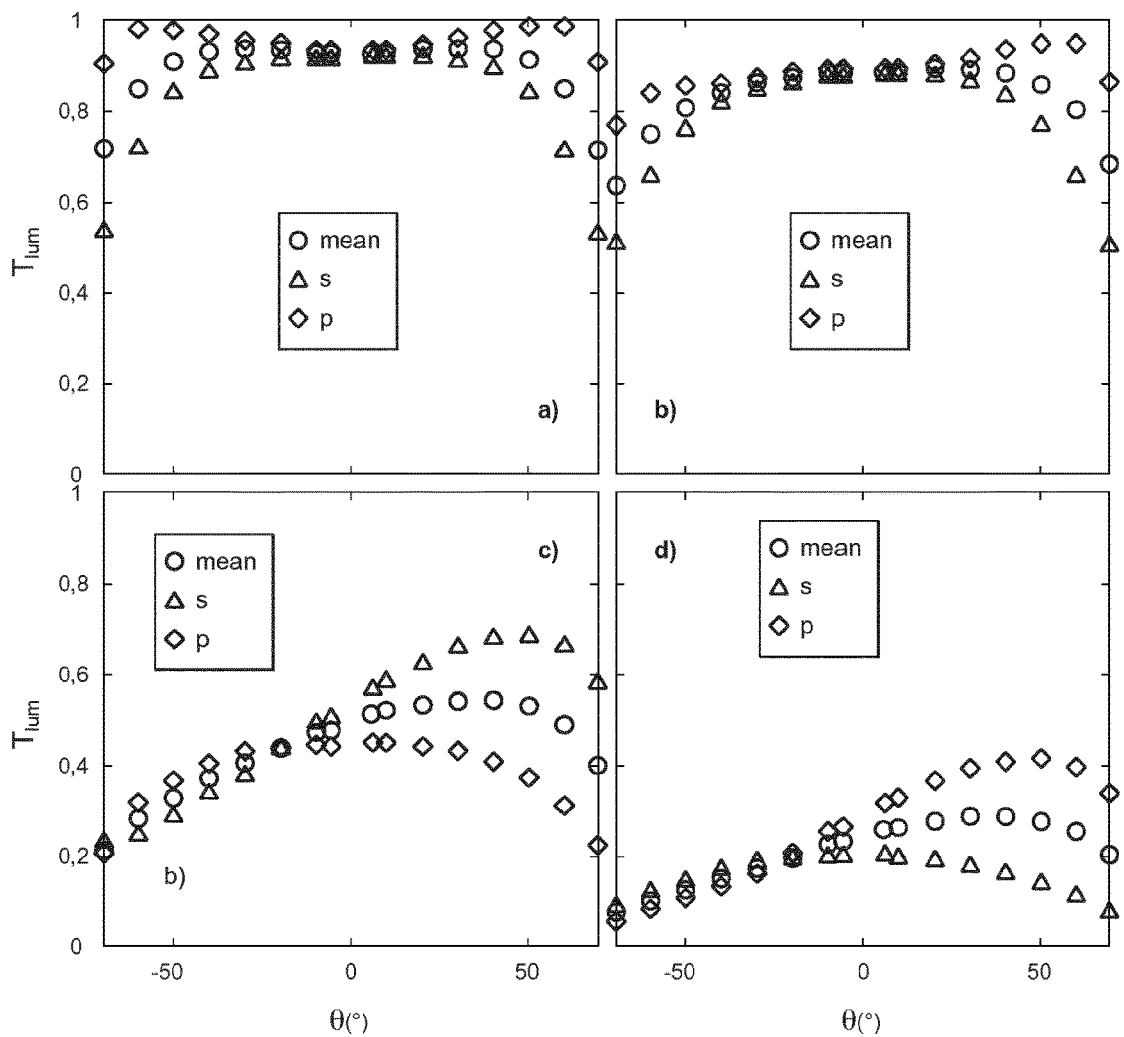
FIG. 4 shows the luminous transmittance as a function of the incidence angle for (a) the example according to example 1 with an angle R of 45° except that the $SiO_2$ columns are uncoated by ALD, and (b) to (d) show the same columns coated with TiN using 400, 500 and 600 cycles of ALD, respectively.

The maximum luminous transmittance can be tweaked by changing the thickness of TiN on the columns, which is represented by doing more or less ALD cycles, leading to thicker or thinner films (see FIG. 3 and FIG. 4).

Second Embodiment

In another embodiment, the nanocolumns are made of $WO_3$. This material can be put in a state wherein it has absorbing properties when an electrical potential is applied. In fact, $WO_3$ is an electrochromic material and so the columns can become absorbing on demand and therefore create this effect of variable transmission as a function of angle of incidence.

The following example corresponds to numerical parameters in accordance with the invention

| Example 3 | Material | Physical thickness | Method of deposition |
| --- | --- | --- | --- |
| Substrate | See general procedure | 1 mm | n/a- |
| First transparent electrode | ITO | 70 nm | Vacuum evaporation |
| Electrochromic layer | $WO_3$ | 350 nm | GLAD ($\alpha$ = 77; $\beta$ = 45, porosity of the columns 60%) |
| Encapsulating layer/electrolyte | $SiO_2$ | Number of cycles: 1000 | ALD |
| Ion reservoir layer | $Ta_2O_5$ or NiO | 200 nm | Vacuum evaporation |
| Second transparent electrode | ITO | 70 nm | Vacuum evaporation |

Figure 5:
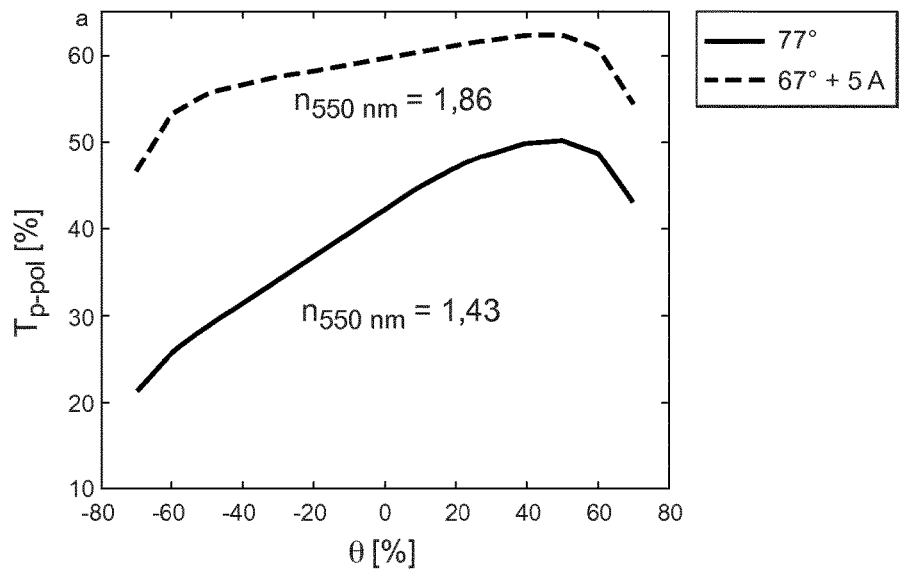
FIG. 5 shows the transmittance at 1000 nm of GLAD deposited $WO_3$ columns in an activated state (colored state) as a function of the incidence angle for the example 3 according to the invention at a deposition angle α of 77° (refractive index of 1.43 in deactivated state or bleached state) and at a deposition angle α of 67°+5 A of ion assist (refractive index of 1.86), following intercalation of $Li^+$ ions (16% and 17% respectively) for p polarization.

FIG. 5 shows the angular selectivity of two GLAD $WO_3$ thin films intercalated with $Li^+$ ions in order to render them absorbing.

Third Embodiment

In another embodiment, the nanocolumns are made of $SiO_2$ deposited by GLAD, the upper layer is TiN deposited by ALD, as in the first exemplified embodiment, and the TiN upper layer is partly removed at the column heads by dry etching.

Dry etching of TiN thin films is carried out using inductively coupled plasma reactive ion etcher (ICPRIE) (A-Tech System, Korea). The ICPRIE system consists of loadlock chamber, main process chamber and substrate susceptor with advanced cooling system. The substrate is cooled by He gas which is filled between the substrate and susceptor chilled by a circulator. The main coil operated at 13.56 MHz is located on the chamber lid to generate high-density plasma. Another separate radio frequency (rf) power of 13.56 MHz is capacitively coupled to the substrate susceptor to control the ions' energy in the plasma.

TiN thin film is then etched using a $Cl_2$/Ar 40/60 gas mix with a coil rf power of 900 W, and a dc-bias voltage of 400V.

Figure 6:
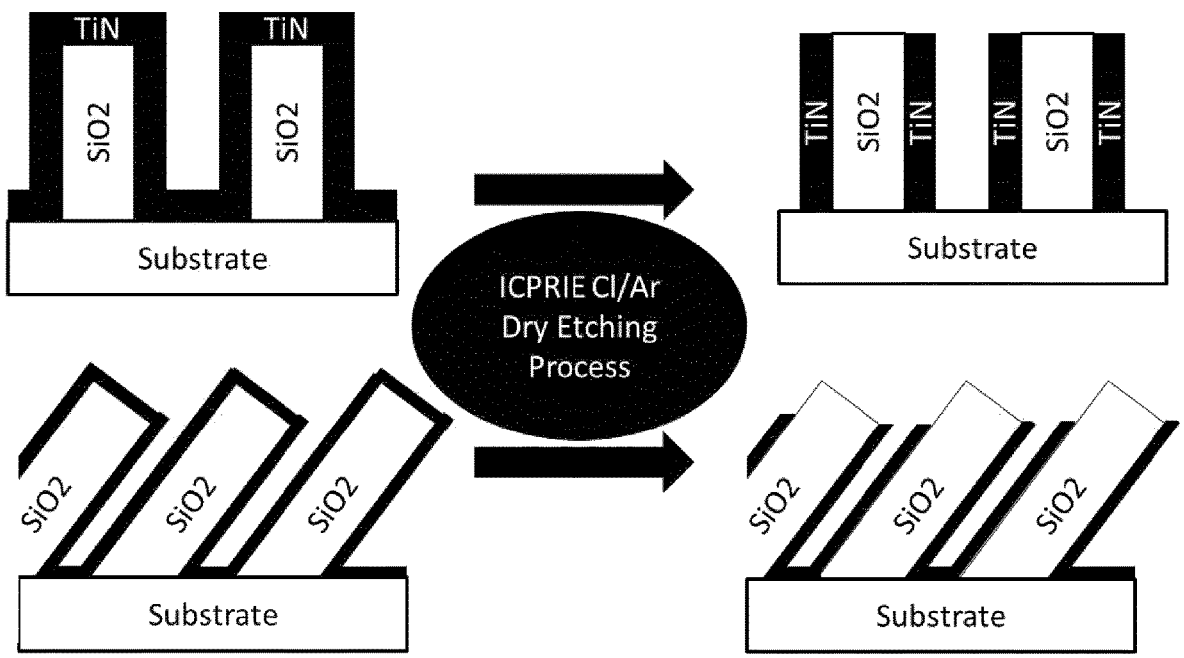
FIG. 6 is a schematic representation of a coating according to a third embodiment of the invention wherein part of the upper layer is removed by dry etching.

FIG. 6 is a schematic representation of a coating according to this embodiment, both with straight and tilted columns.

The invention claimed is:

1. An optical article comprising a substrate with a front main face and with a rear main face, at least one of the main faces being coated with a columnar micro- or nano-structured coating, wherein
the substrate and the optical article are transparent or can be put in a state where they are transparent in at least a part of the visible region ranging from 380 to 780 nm, along at least one incidence angle;
said columnar micro- or nano-structured coating comprises at least an array of columns comprising each a core and an upper layer covering said core, the core and the upper layer being structurally and/or chemically different and wherein said core and/or upper layer have light absorbing properties or can be put in a state where they have light absorbing properties with an extinction coefficient "k" equal to or higher than $10^{-2}$ in at least a part of the light spectrum ranging from 250 to 2500 nm and are able to cause a change in transmission or in reflection of incident light through the optical article as a function of the angle of incidence of light, and
wherein the core of the columns has a porosity that is equal to or higher than 30%.

2. The optical article according to claim 1, wherein the columns have a height ranging from 50 to 1000 nm.

3. The optical article according to claim 1, wherein a tilt angle beta β ranging from 0 to 50° is defined between the columns and the at least one main face of the substrate.

4. The optical article according to claim 1, wherein the at least one main face of the substrate contains predetermined patterns covered with a columnar micro- or nano-structured coating.

5. The optical article according to claim 1, wherein the core and/or the upper layer have permanent light absorbing properties with an extension coefficient "k" equal to or higher than $10^{-2}$ at least in a part of the visible range from 380 to 780 nm.

6. The optical article according to claim 5, wherein the core and/or the upper layer comprise(s) one or more substoichiometric oxides, and/or substoichiometric nitrides, or substoichiometric fluorides.

7. The optical article according to claim 5, wherein the core and/or the upper layer further has (have) conducting properties and comprise(s) one or more materials selected from: diamond like carbon DLC, graphene/graphite; metals conductive nitrides; semiconductors, doped or not; or transparent conductive oxides.

8. The optical article according to claim 1, wherein the core and/or the upper layer can be put in a state where they have light absorbing properties with an extension coefficient "k" equal to or higher than $10^{-2}$ at least in a part of the visible range ranging from 380 to 780 nm and are configured to reversibly switch from a deactivated state to an activated state upon the application of activation or deactivation means, respectively.

9. The optical article according to claim 8, wherein the core and/or the upper layer comprise(s) one or more chromogenic materials.

10. The optical article according to claim 1, wherein the core is transparent and the upper layer has light absorbing properties or can be put in a state where the upper layer has light absorbing properties with an extension coefficient "k" equal to or higher than $10^{-2}$ in at least a part of the light spectrum ranging from 250 to 2500 nm.

11. The optical article according to claim 1, wherein the core comprises one or more stoichiometric oxides or nitrides, or fluorides, or a mixture of organic-inorganic materials.

12. The optical article according to claim 1, wherein the core and/or the upper layer has (have) a high refractive index that is higher than or equal to 1.8, or has (have) a medium refractive index that is lower than 1.8.

13. The optical article according to claim 1, wherein the upper layer is absent from the columns head.

14. An optical lens comprising a substrate with a front main face and with a rear main face, at least one of the main faces being coated with a columnar micro- or nano-structured coating, wherein
the substrate and the optical article are transparent or can be put in a state where they are transparent in at least a part of the visible region ranging from 380 to 780 nm, along at least one incidence angle;
said columnar micro- or nano-structured coating comprises at least an array of columns comprising each a core and an upper layer covering said core, the core and the upper layer being structurally and/or chemically different and wherein said core and/or upper layer have light absorbing properties or can be put in a state where they have light absorbing properties with an extinction coefficient "k" equal to or higher than $10^{-2}$ in at least a part of the light spectrum ranging from 250 to 2500 nm and are able to cause a change in transmission or in reflection of incident light through the optical article as a function of the angle of incidence of light, and
wherein the core of the columns has a porosity that is equal to or higher than 30%.

15. Method of manufacture of an optical article comprising a substrate with a front main face and with a rear main face, at least one of the main faces being coated with a columnar micro- or nano-structured coating, wherein
the substrate and the optical article are transparent or can be put in a state where they are transparent in at least a part of the visible region ranging from 380 to 780 nm, along at least one incidence angle;
said columnar micro- or nano-structured coating comprises at least an array of contiguous columns comprising each a core and an upper layer covering said core, the core and the upper layer being structurally and/or chemically different and wherein said core and/or upper layer have light absorbing properties or can be put in a state where they have light absorbing properties with an extinction coefficient "k" equal to or higher than $10^{-2}$ in at least a part of the light spectrum ranging from 250 to 2500 nm;
the method comprising the following steps:
(a) depositing on the at least one main surface of the substrate, the core by physical directional deposition to create the array of contiguous columns;
(b) depositing, on the core of the columns, at least one—upper layer by atomic layer deposition; the parameters of the deposition of the core and of the upper layer being controlled so as to provide a change in transmission or reflection of incident light through the optical article as a function of the angle of incidence of light, wherein the core of the columns has a porosity that is equal to or higher than 30%.

16. The optical article according to claim 1, wherein the core of the columns has a porosity that is equal to or higher than 45.

17. The optical article according to claim 1, wherein the core of the columns has a porosity ranging from 75 to 85%.

18. The optical article according to claim 1, wherein the columns have a height ranging from 200 to 300 nm.

19. The optical article according to claim 1, wherein the core and/or the upper layer has (have) a high refractive index that is higher than or equal to 1.9, or has (have) a medium refractive index that is lower than 1.7.

20. The optical article according to claim 1, wherein the core and/or the upper layer has (have) a high refractive index that is higher than or equal to 2 or has (have) a medium refractive index that is lower than or equal to 1.6.

* * * * *